US012557276B2

(12) United States Patent
Xie et al.

(10) Patent No.: US 12,557,276 B2
(45) Date of Patent: Feb. 17, 2026

(54) MEMORY DEVICE AND METHOD OF FORMING THE SAME

(71) Applicant: Yangtze Memory Technologies Co., Ltd., Wuhan (CN)

(72) Inventors: Wei Xie, Wuhan (CN); Dongyu Fan, Wuhan (CN); Di Wang, Wuhan (CN); Wenxi Zhou, Wuhan (CN); Zhiliang Xia, Wuhan (CN); Zongliang Huo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 505 days.

(21) Appl. No.: 18/082,048

(22) Filed: Dec. 15, 2022

(65) Prior Publication Data

US 2024/0188290 A1 Jun. 6, 2024

(30) Foreign Application Priority Data

Dec. 1, 2022 (CN) ......................... 202211532502.X

(51) Int. Cl.
*H10B 43/20* (2023.01)
*H10D 30/69* (2025.01)
*H10D 64/01* (2025.01)

(52) U.S. Cl.
CPC ............ *H10B 43/20* (2023.02); *H10D 30/693* (2025.01); *H10D 30/697* (2025.01); *H10D 64/037* (2025.01)

(58) Field of Classification Search
CPC .... H10B 43/20; H10D 64/037; H10D 30/693; H10D 30/697
See application file for complete search history.

(56) References Cited

U.S. PATENT DOCUMENTS

2020/0395374 A1* 12/2020 Huo .................... H01L 23/5226
2022/0367510 A1* 11/2022 Liu ..................... H01L 21/7806

\* cited by examiner

*Primary Examiner* — Richard A Booth
(74) *Attorney, Agent, or Firm* — Anova Law Group, PLLC

(57) ABSTRACT

Memory device and formation method are provided. The memory device includes a stack structure; and a plurality of gate line slit structures vertically extending through the stack structure to divide the stack structure into a plurality of stack portions. The plurality of GLS structures extend along a first direction in a lateral plane of the stack structure and are arranged along a second direction substantially perpendicular to the first direction. Each stack portion is between corresponding adjacent gate line slit structures. At least one edge stack portion, along the second direction of the plurality of stack portions at edge of the stack structure includes a configuration different from a non-edge stack portion of the plurality of stack portions along the second direction.

15 Claims, 12 Drawing Sheets

MEMORY DEVICE AND METHOD OF FORMING THE SAME

CROSS-REFERENCE TO RELATED APPLICATION

This application claims the priority to Chinese Patent Application No. 202211532502.X, filed on Dec. 1, 2022, the content of which is incorporated herein by reference in its entirety.

FIELD OF THE DISCLOSURE

The present disclosure generally relates to the field of memory device and, more particularly, relates to memory device and formation method thereof.

BACKGROUND

A non-volatile memory device may be a three-dimensional (3D) memory device in a form of NAND, NOR, cross-point, or the like. The non-volatile memory device may include a large number of non-volatile memory cells arranged in rows and columns. The memory cells are stacked over one another. Each group of memory cells may share a plurality of access lines, such as word lines and bit lines.

For forming a 3D memory device, gate line slits may be used to vertically divide the to-be-formed memory device into stacked portions. As the number of memory cell layers increases, the height of the stacked portions keeps increasing. Problems arise, however, as widths of the stacked portions do not increase proportionally, causing a high height-to-width ratio of the stacked portions (e.g., memory blocks) and thus a high risk of block tilting during formation of the memory device.

The disclosed devices and methods are directed to solve one or more problems set forth above and other problems in the art.

BRIEF SUMMARY OF THE DISCLOSURE

One aspect of the present disclosure provides a memory device. The memory device includes a stack structure, and a plurality of gate line slit (GLS) structures vertically extending through the stack structure to divide the stack structure into a plurality of stack portions. The plurality of GLS structures extend along a first direction in a lateral plane of the stack structure, and are arranged along a second direction substantially perpendicular to the first direction. Each stack portion is between corresponding adjacent GLS structures. At least one edge stack portion, along the second direction of the plurality of stack portions at edge of the stack structure includes a configuration different from a non-edge stack portion of the plurality of stack portions along the second direction.

Another aspect of the present disclosure provides a memory device. A memory device includes a memory plane. The memory plane includes memory blocks and gate line slit (GLS) structures extending vertically through the memory blocks. The GLS structures extend along a first direction and are arranged along a second direction substantially perpendicular to the first direction. At least one edge block, along the second direction of the memory plane between an edge GLS structure and an adjacent GLS structure includes a configuration different from a non-edge block of the memory plane along the second direction.

Another aspect of the present disclosure provides a method for forming a memory device. The method includes forming a plurality of gate line slits (GLSs) extending vertically through the alternating dielectric stack to divide the alternating dielectric stack into a plurality of dielectric-stack portions. The plurality of GLSs extend along a first direction and are arranged along a second direction substantially perpendicular to the first direction. Each dielectric-stack portion is formed between corresponding adjacent GLSs. The plurality of GLSs is formed in a manner such that at least one edge dielectric-stack portion along the second direction includes a configuration different from a non-edge dielectric-stack portion of the plurality of dielectric-stack portions along the second direction.

Other aspects of the present disclosure may be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1A:
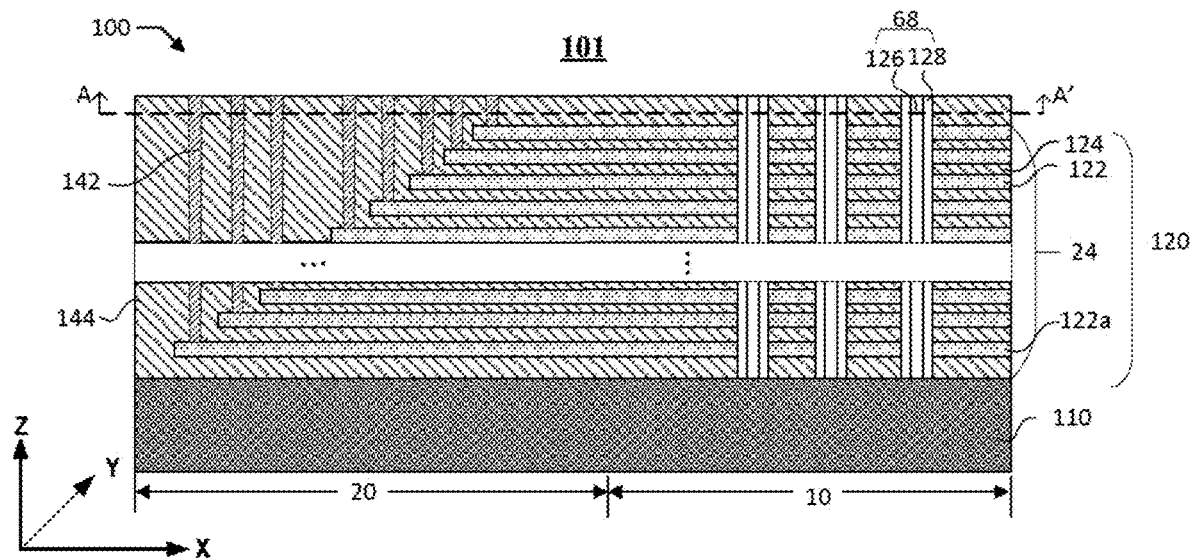
FIG. 1A illustrates a cross-section view of an exemplary memory device consistent with various disclosed embodiments of the present disclosure.

Reference will now be made in detail to exemplary embodiments of the present disclosure, which are illustrated in the accompanying drawings. Wherever possible, the same reference numbers will be used throughout the drawings to refer to the same or like parts.

For illustrative purposes, specific configurations and arrangements are described herein, and a person skilled in the pertinent art should understand that other configurations and arrangements without departing from the spirit and scope of the present disclosure are also encompassed within the scope of the present disclosure. It will be apparent to a person skilled in the pertinent art that the present disclosure can also be employed in a variety of other applications.

It should be noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain un-patterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can include one or more layer thereupon, there-above, and/or there-below. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., +10%, +20%, or +30% of the value).

As used herein, the term "memory device" refers to a semiconductor device at least including vertically oriented strings of memory cell transistors (referred to herein as "memory cell strings," such as NAND strings) disposed over a laterally oriented substrate so that the memory cell strings extend in the vertical direction with respect to a lateral surface of the substrate.

As used herein, the term "vertical/vertically" means nominally perpendicular to the lateral surface of a substrate. Accordingly, a lateral direction of the substrate is along the lateral surface of the substrate, and a vertical direction is substantially perpendicular to the lateral surface (or a lateral direction) of the substrate of a memory device.

As disclosed herein, different structures/layers may be vertically aligned and stacked based on lateral central regions/lines, e.g., having lateral central regions and/or lateral central lines of these vertically aligned structures (or layers) substantially overlapped with one another.

The present disclosure provides a memory device and a method of forming the memory device. An example of a memory device includes a stack structure over a substrate or over a semiconductor layer same or different from the substrate; and a plurality of gate line slit (GLS) structures vertically extending through the stack structure, to divide the stack structure into a plurality of stack portions (e.g., to form a plurality of memory blocks and/or memory fingers). Each stack portion is between corresponding adjacent gate line slit structures. At least one edge stack portion of the plurality of stack portions at edge of the stack structure includes a configuration (e.g., a width, a shape, and/or a component) different from a non-edge stack portion (e.g., to form a non-edge memory block or a non-edge memory finger) of the plurality of stack portions. In various embodiments, the at least one edge stack portion may have a width larger than any non-edge stack portion. Additionally or alternatively, the at least one edge stack portion may have a shape and/or component different from any non-edge stack portion. For ease of interpretation, under certain circumstances, only memory blocks are discussed in some embodiments. However, it is to be noted, under such circumstances, memory fingers may be similarly applied and encompassed in the present disclosure.

According to one example, a memory device disclosed herein may include multiple memory planes. Each memory plane may include multiple memory blocks. Each memory block may include a number of memory cells. The multiple memory blocks in a memory plane may include a first edge block at a first edge of the memory plane, a second edge block at a second edge of the memory plane that is opposite to the first edge block, and non-edge block(s) between the first and the second edge blocks. One or both of the first and the second edge blocks may be configured different from any of non-edge memory block(s). In various embodiments, the first and/or second edge blocks may have a width larger than any non-edge block. Additionally or alternatively, the first and/or second edge blocks may have a shape and/or component different from any non-edge block.

Figure 1B:
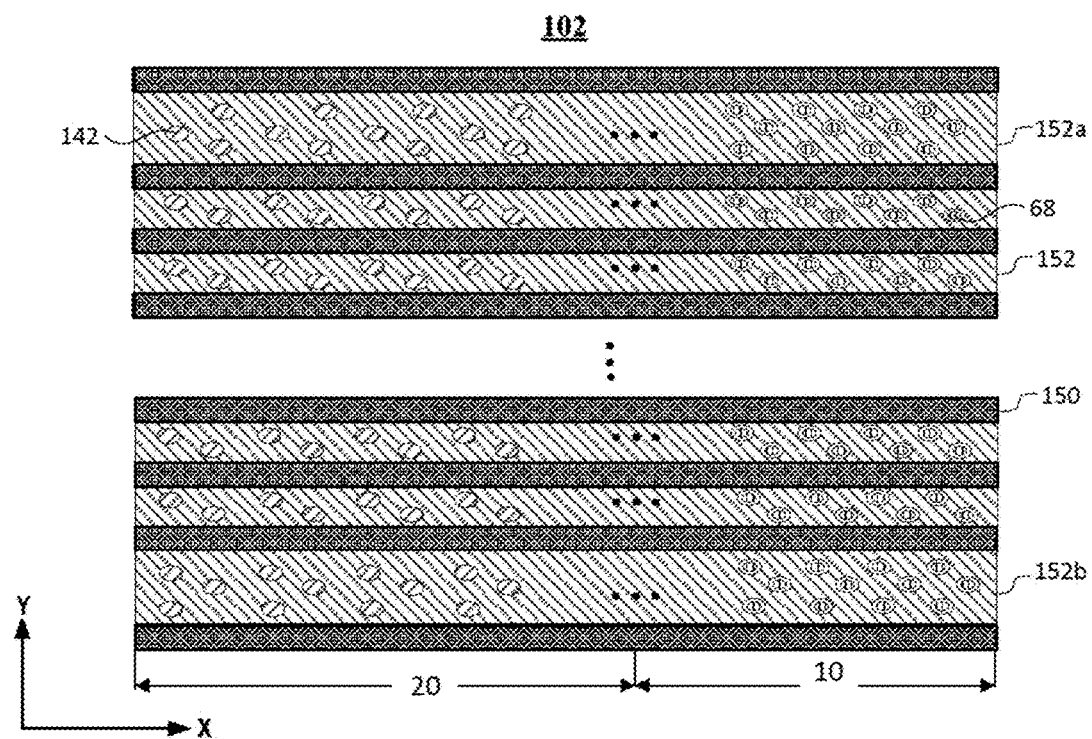
FIG. 1B illustrates a cross-section view along A-A' direction of the exemplary memory device in FIG. 1A consistent with various disclosed embodiments of the present disclosure.

FIGS. 1A and 1B illustrate the structure of an exemplary memory device 100 according to various embodiments of the present disclosure. For example, FIG. 1A illustrates a cross-section view 101 of the exemplary memory device 100, and FIG. 1B illustrates a cross-section view 102 of the exemplary memory device 100 in a lateral X-Y plane defined by AA' in FIG. 1A.

As illustrated in the cross-section view 101 in FIG. 1A, the memory device 100 may include a substrate 110, and a plurality of conductor/dielectric layer pairs 24 formed over the substrate 110 to form a stack structure 120 over the substrate 110. The stack structure 120 may include a cell array structure formed in a cell array region 10 and a staircase structure formed in a staircase structure (SS) region 20. It is to be noted that, while only one staircase structure region 20 is illustrated in FIG. 1A, in some embodiments, the stack structure 120 may include more than one staircase structure region 20. For example, there may be another staircase structure region 20 on the right side of the cell array region 10 illustrated in FIG. 1A.

The substrate 110 may include silicon (e.g., single crystalline silicon), silicon germanium (SiGe), gallium arsenide (GaAs), germanium (Ge), silicon on insulator (SOI), and/or any other suitable materials.

In one embodiment, the substrate 110 is a silicon substrate. The substrate 110 may be undoped, partially doped, or fully doped by p-type or n-type dopants. The doping of the substrate may be in the thickness direction and/or the width direction. The silicon substrate may be a thinned silicon substrate, e.g., a thinned single crystalline silicon layer. In some embodiments, the single crystalline silicon layer has a thickness between 200 nm to 50 μm. In some embodiments, the single crystalline silicon layer has a thickness between 500 nm to 5 μm. The single crystalline silicon layer may be partially or fully doped with n-type and/or p-type dopants.

In some embodiments, the memory device 100 may not include a substrate 110, but rather include a semiconductor layer same or different than the substrate 110. For example, for some memory devices 100, a substrate of a memory device may be removed and replaced with s semiconductor layer for conductive purposes. In one embodiment, the semiconductor layer may be a layer containing polysilicon or another different semiconductor material.

The conductor/dielectric layer pairs 24, formed over the substrate 110, may also be referred to as an "alternating conductor/dielectric stack 24." Each conductor/dielectric layer pair 24 may include a conductor layer 122 and a dielectric layer 124, extending to the cell array region 10 and the staircase structure (SS) region 20.

The conductor layers 122 extended in the staircase structure region 20 may act as word lines. The staircase structure in the staircase structure region 20 thus includes a plurality of word line tiers 122 having different stair lengths along a lateral direction (e.g., along X-axis) of the substrate 110. For example, as shown in FIG. 1A, the conductor layer 122a closest to the substrate 110 may have a greatest stair length among all of the plurality of conductor layers 122 in the staircase structure region 20.

The conductor layers 122 and the dielectric layers 124 in the alternating conductor/dielectric stack 24 may alternate in the vertical direction (or Z-axis) with respect to the substrate 110. For example, except for the ones at the top or bottom of alternating conductor/dielectric stack 24, each conductor layer 122 may be adjoined by two dielectric layers 124 on both sides, and each dielectric layer 124 may be adjoined by two conductor layers 122 on both sides along the vertical direction. The conductor layers 122 may have the same thickness or different thicknesses. The dielectric layers 124 may also have the same thickness or different thicknesses. In addition, the thickness of the conductor layers 122 and dielectric layers 124 may be also the same or different. In some embodiments, alternating conductor/dielectric stack 24 may include additional conductor layers or more dielectric layers (not illustrated) with different materials and/or thicknesses than those of the conductor/dielectric layer pairs.

The conductor layers 122 may include conductive materials, such as tungsten (W), cobalt (Co), copper (Cu), aluminum (Al), doped silicon, silicides, and/or any other suitable conductor materials. The dielectric layers 124 may include dielectric materials, such as silicon oxide, silicon nitride, silicon oxynitride, and/or any other suitable dielectric materials.

In some embodiments, the memory device 100 may be a NAND Flash memory device. The stack structure 120 in the cell array region 10 over the substrate 110 may include cell array structure including memory cells. The memory cells may include a plurality of memory cell strings, which include channel structures extending through the conductor/dielectric layer pairs 24 over the substrate 110.

The memory cell strings 68 may include a plurality of control gates for the memory cells. The conductor layers 122 in the alternating conductor/dielectric stack 24 in the cell array region 10 may act as a control gate for each memory cell of the memory cell string 68.

In one embodiment, a memory cell string 68 may include a channel layer, such as a semiconductor channel 126, and a composite layer 128. The semiconductor channel 126 may include silicon, such as amorphous silicon, polysilicon, or single crystalline silicon. The composite layer 128 may include, for example, a tunneling layer, a storage layer (or "charge trap/storage layer"), and a blocking layer. Each memory cell string 68 may have a cylinder shape or other different shapes. The semiconductor channel 126, the tunneling layer, the storage layer, and the blocking layer may be arranged along a direction from the central toward the outer surface of the cylinder in such order. In one embodiment, the composite layer 128 may include ONO (oxide/nitride/oxide) dielectrics having, e.g., a tunneling layer including silicon oxide, a storage layer including silicon nitride, and a blocking layer including silicon oxide. In other embodiments, the memory cell string 68 may include any suitable configurations. For example, the memory cell string 68 may include a channel layer formed between a dielectric filler and an ONO gate dielectric.

The memory cell strings 68 may include a select gate (e.g., a source select gate) at an end, of the memory cell string 68, that is closer to the substrate 110, and another select gate (e.g., a drain select gate) at the other end, of the memory cell string 68, that is further away from substrate 110.

The select gate may control the on/off state and/or conductance of the semiconductor channel 126 of the memory cell string 68. In some embodiments, select gates include conductor materials including, but not limited to, W, Co, Cu, Al, doped silicon, silicides, and/or any combination thereof. For each memory cell string 68, an epitaxial plug (not illustrated) may be formed at the lower end of each memory cell string closer to the substrate 110. The epitaxial plug may contact both the semiconductor channel 126 and a doped region of substrate 110, to function as the channel controlled by the select gate at the lower end of the memory cell string.

The select gate of the memory cell string 68 may include one or more lower conductor layers of the alternating conductor/dielectric stack, such as the conductor layer 122a closer to the substrate 110 as shown in FIG. 1A. Alternatively, the select gate of the memory cell string 68 may be a separate conductor layer formed between the substrate and the alternating conductor/dielectric stack 24. In some embodiments, the memory cell string 68 further includes another select gate formed by one or more upper conductor layers of the alternating conductor/dielectric stack further away from the substrate 110. The select gate of the memory cell string may also be formed by a separate conductor layer above the alternating conductor/dielectric stack away from the substrate 110.

In some embodiments, the stack structure 120 over the substrate 110 may further include word line contact plugs 142 formed in the staircase structure region 20. The word line contact plugs 142 may extend vertically within a dielectric layer 144 over the substrate 110 in the staircase structure region 20. Each word line contact plug 142 may have an end (e.g., a lower end) in contact with a corresponding word line tier, e.g., a corresponding conductor layer 122 in the staircase structure region 20, to individually address the corresponding word line of the stack structure.

In some embodiments, each word line contact plug 142 contacts a corresponding word line tier 122 (e.g., a portion of a conductor layer 122) in the staircase structure region 20 on a side away from the substrate 110 along a vertical direction. The word line contact plugs 142 may include a conductive material formed by filling contact holes and/or contact trenches. In one embodiment, the conductive material may be W. In some embodiments, filling the contact holes and/or contact trenches may include depositing a barrier layer, an adhesion layer, and/or a seed layer before depositing the conductive material.

FIG. 1B illustrates a cross-section view 102 along A-A' direction of the memory device 100 in FIG. 1A. In various embodiments, the memory device 100 may further include a plurality of gate line slit (GLS) structures 150 that vertically divide the stack structure 120 over the substrate 110 into different vertically aligned stack portions 152 (e.g., memory blocks or memory fingers) between adjacent gate line slit structures 150. The gate line slit structures 150 may extend along a first lateral direction (e.g., along X-axis as illustrated in FIG. 1B), and may be arranged to be spaced apart from each other along a second lateral direction (e.g., along Y-axis as illustrated in FIG. 1B) substantially perpendicular to the first lateral direction. The formed different stack portions 152 (e.g., memory blocks and/or memory fingers) of the memory device 100 also extend along the first lateral direction (e.g., along X-axis) while being arranged to be spaced apart from each other along the second lateral direction (e.g., along Y-axis), as illustrated in FIG. 1B.

In some embodiments, gate line slit structures 150 in the memory device 100 continuously extend through the cell array region 10 and the staircase structure region 20 along the first lateral direction, to divide the memory device into different memory blocks. For example, gate line slit structure 150 in FIG. 1B continuously extends through the cell array region 10 and the staircase structure region 20 along the first lateral direction. In some embodiments, gate line slit structures 150 in the memory device 100 discretely extend through the cell array region 10 and/or the staircase structure region 20 along the first lateral direction, to divide the memory device 100 into different memory fingers (not illustrated). In some embodiments, the memory device 100 may include both memory blocks and memory fingers separated by the gate line slit structures as needed.

In a fabrication process of the memory device 100, the gate line slit structures 150 may be formed by first forming gate line slits, which are aligned trenches formed through an etching process. After formation, the gate line slits may divide the stack structure into different portions corresponding to the eventually formed stack portions (e.g., memory blocks or memory fingers). These divided portions include two edge portions on the two edges of the in-fabrication memory structure and a large number of non-edge portions between the two edge portions.

In some embodiments, in the fabrication process of the memory device 100, the gate line slits may experience one or more wet processes and following dry processes (a wet process and the following dry process may be referred to as "a wet/dry cycle") before eventually forming the gate line slit structures (e.g., by filling the slits with the insulation material). Accordingly, each edge or non-edge portion may experience pressure from each sidewall when a liquid flows through the gate line slits or trenches. As will be described further in detail in FIG. 2, during these wet/dry cycles, the two edge portions may experience a pressure difference due to unbalanced environments faced by the two sidewalls of each edge portion. The pressure difference may become large or larger when the height of the gate line slits increases, which may cause the tilting of the formed two edge portions.

In some embodiments, by increasing the width of the two edge portions, it may allow these portions to hold a higher pressure during a wet/dry cycle, thereby preventing the edge portions from tilting during the wet/dry processes. This then allows the eventually formed memory blocks or memory fingers to have a shape and/or orientation as expected, thereby improving the quality and performance of the formed memory device 100.

FIG. 1B illustrates two edge stack portions that have a larger width than the non-edge stack portions. As can be seen, the two edge stack portions 152a and 152b of the memory device 100 have a larger width than the non-edge stack portions 152. The wider edge stack portions 152a and 152b are formed by using a photomask that covers the wider edge portions during the etching process in the formation of gate line slits. These wider edge portions may hold a larger pressure when compared to non-widened edge portions of other memory devices during a fabrication process. The as-formed memory device 100 thus has better quality and performance, especially for the memory devices with a larger height and increased capacity.

Figure 2:
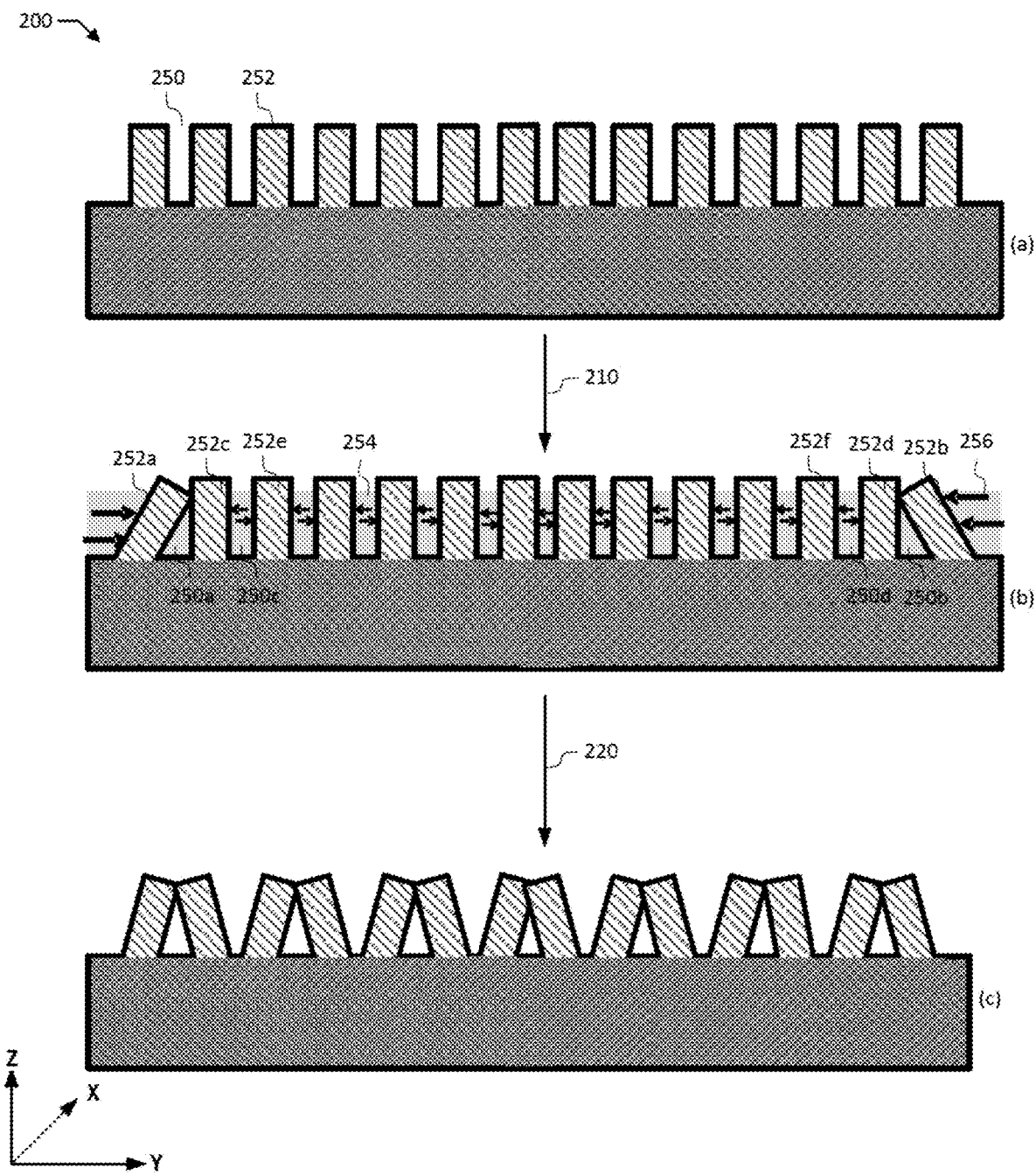
FIG. 2 illustrates an exemplary phenomenon of memory block tilting in a fabrication process according to various embodiments of the present disclosure.

FIG. 2 illustrates an exemplary phenomenon of memory block tilting according to various embodiments of the present disclosure. The wet/dry cycle may include a wet process 210 and a following dry process 220 as illustrated in FIG. 2.

Part (a) of FIG. 2 illustrates a cross-section view of an exemplary structure 200 formed in a fabrication process of forming a memory device in accordance with various embodiments. As illustrated, the structure 200 may include a plurality of gate line slits 250 formed during a fabrication process. In addition, the structure 200 may include a plurality of separate portions 252 divided by the gate line slits 250. These portions 252 may correspond to the eventually formed memory blocks or memory fingers. For example, each portion may continuously or discretely extend (not illustrated) along a first lateral direction (e.g., along X-axis as illustrated in FIG. 2). In addition, each portion may include a stack structure (e.g., alternating sacrificial/dielectric layers formed on the substrate). The distance between the adjacent portions 252 may be the same or different, depending on the design pattern of the photomask used in the formation of the gate line slits 250.

In some embodiments, the gate line slits 250 may be formed through a wet etching and/or dry etching process, such as deep reactive ion etching (DRIE). In some embodiments, after forming the gate line slits 250, a cleaning process may be utilized to clean the residues left after the etching process. In some embodiments, the gate line slits 250 may be utilized for the gate replacement process, which may include removal of the sacrificial layers and further depositing the conductive material (also referred to as "gate electrode") as well as certain barrier layer, adhesion layer, and/or seed layer prior to depositing the conductive material. In some embodiments, after removal of the sacrificial layer and after depositing each of the barrier layer, adhesion layer, seed layer, or conductive material through the gate line slits, the gate line slits 250 may be also cleaned after each process. Accordingly, the formed gate line slits 250 may go through multiple wet/dry cycles before eventually being filled with insulation material (or certain other materials) to form the gate line slit structures.

Part (b) of FIG. 2 illustrates the structure 200 of an in-fabrication memory device going through a wet process 210, which includes certain liquids 254 added into the gate line slits 250 to flow through the trenches between the portions 252. Part (b) of FIG. 2 also illustrates pressure experienced by the sidewalls of each portion 252 during a wet/dry cycle (e.g., during an evaporation process). The pressure experienced by the sidewalls may be due to the surface tension of the liquid during the evaporation process. As can be seen, for the sidewalls of the portions 252 that are not on the two edges (e.g., left and right edges in FIG. 2), the pressure experienced by both sidewalls of a non-edge portion 252 is substantially the same due to the repetitiveness of the structure 200. Accordingly, for the non-edge portions, due to the similar pressure experienced by the sidewalls from the opposite sides, which counteracts each other, the non-edge portions may remain balanced, and thus will not tilt if there is no influence from other sources.

For the edge portions, the pressure experienced by the two sidewalls from two opposite directions may be different. For example, for the edge portion 252a or 252b, the pressure experienced by the outer sidewall facing the outer edge of the structure may be larger than the pressure experienced by the inner sidewall facing an inner stack portion, as indicated by the larger arrows 256 towards the outer sidewall, as illustrated in Part (b) of FIG. 2. The larger pressure experienced by the outer sidewall of the edge portion 252a or 252b may be due to a faster flowing rate and/or a larger volume of the liquid outside the edge stack portion during a dry process, which may become more obvious with the increased height of the structure 200. Due to a larger pressure experienced by the outer sidewall of the edge portions 252a or 252b, a net pressure towards the inner sidewall is thus formed during a dry process, leading the edge portion 252a or 252b to tilt towards the inner sidewall if the edge portions are not widened, as illustrated in Part (b) of FIG. 2.

In some embodiments, the tilting of the edge portion 252a or 252b may cause the liquid volume and/or flow rate of the liquid in the gate line slit 250a or 250b adjacent to the edge portions 252a or 252b to become smaller, which affects the pressure experienced by the outer sidewall of the adjacent portion 252c or 252d. This then disturbs the balance of the pressure experienced by the portion 252c or 252d, leading the portion 252c or 252d to tilt towards the outer sidewall, as shown in Part (c) of FIG. 2. The tilting of portion 252c or 252d also leads the liquid volume in the gate line slit 250c or 250d to become larger, due to the wider space after tilting of the portion 252c or 252d towards the edge portion 252a or 252b. This further causes the portion 252e or 252f to tilt towards the inner sidewall, as illustrated in Part (c) of FIG. 2. Keeping this way, a domino effect may then occur, which causes the remaining portions 252 to tilt towards one side or the other, as shown in Part (c) of FIG. 2. The tilting of each edge or non-edge portion may become more obvious (e.g., tilting at a large angle) when the height of the memory structure 200 increases, which then prevents a memory device from adding more layers to increase the capacity. Therefore, the tilting of portions 252 becomes problematic in improving the capacity of a memory device in the development of advanced memory devices.

According to various embodiments of the present disclosure, one effective approach to addressing the tilting of edge portions is to increase the width of the edge portions, as described earlier in FIG. 1B and as further described in detail below with reference to FIGS. 3-8F.

Figure 3:
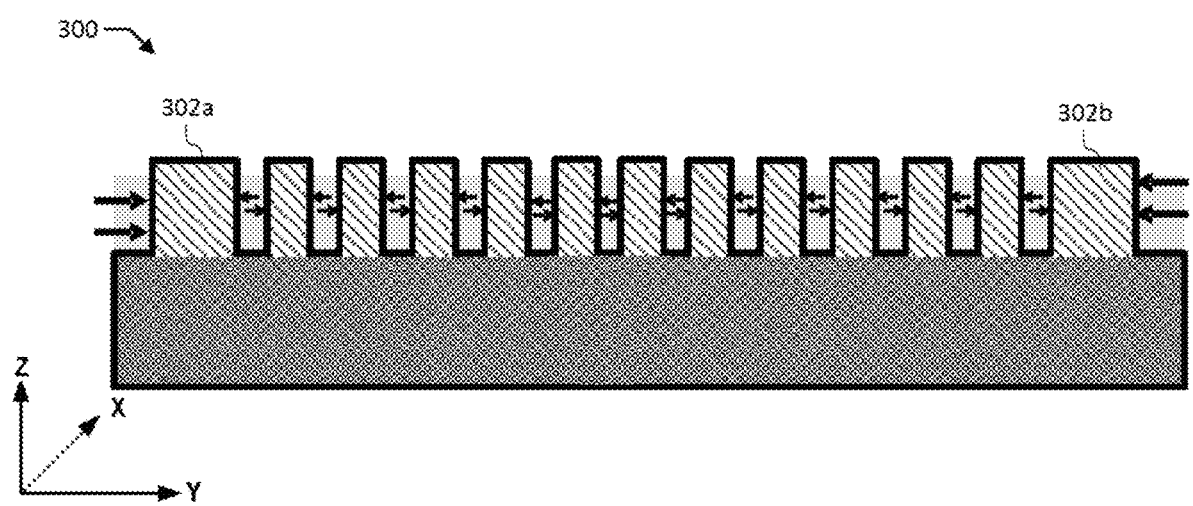
FIG. 3 illustrates a side view of an exemplary in-fabrication structure with widened edge portions according to various embodiments of the present disclosure.

FIG. 3 illustrates a cross-section view 301 of in-fabrication structure 300 with widened edge portions in accordance with various embodiments. As illustrated in the figure, the edge portions 302a or 302b have a larger width than the widths of other non-edge portions. These widened edge portions may hold a larger pressure difference between the inner and outer sidewalls of each edge portion when compared to other non-edge portions, even when the height of the in-fabrication structure 300 increases.

In some embodiments, the exact degree of widening the edge portions 302a and 302b may be determined ahead of the fabrication process. In one example, the width of the edge portions 302a and 302b may have a positive correspondence to the height of the in-fabrication structure 300. The larger the height of the in-fabrication structure 300, the larger the width of the edge portion 302a or 302b can be used. For another example, the width of the edge portions 302a and 302b may be also determined based on the hydrophilicity of the liquid, the width of the gate line slits, the surface tension property of the liquid, the flowing rate of the liquid, contact angle of the liquid with sidewalls, among other possible factors. In some embodiments, the widths of the non-edge portions may or may not change (when compared to other existing fabrication processes) when increasing the width of the edge portions 302a or 302b during a fabrication process.

In one specific example, the width of the edge portions 302a and 302b may be x times larger than those of the non-edge portions, where x can be 1.2, 1.5, 2, 2.5, 3, 3.5, 4, 4.5, 5, 6, 7, 8, 9, 10, or any value between 1.2-10, depending on the various factors described above.

It should be noted that, while only the edge portions 302a/302b are illustrated as having a larger width in FIG. 3, in some embodiments, more than one stack portion on each edge/side of the in-fabrication structure 300 may be widened. For example, one or more non-edge portions adjacent to each edge portion 302a or 302b (also referred to as "adjacent portions") may be widened to have a larger width than the width of the inner non-edge portions. These widened adjacent portions may have a width that is the same as or different from the width of the edge portion 302a or 302b. In one example, if there are more than one widened adjacent portion, these adjacent portions may become narrower or narrower when approaching the inner non-edge portions, until one adjacent portion has the same width as other inner non-edge portions. In some embodiments, there are hundreds or thousands of non-edge portions in an in-fabrication structure 300, among which there may be 1-10 (or another different number) adjacent portions also widened to improve the sturdiness of the in-fabrication structure 300.

It is to be noted that, while increasing the width of the edge portions 302a and 302b can prevent the tilting of the edge or non-edge portions during a fabrication process, the disclosure is not limited to such design or configuration. Additional or alternative strategies for improving the sturdiness of the edge portions of an in-fabrication structure 300 are further described in view of the eventually formed memory devices illustrated in FIGS. 4A-4B.

Figure 4A:
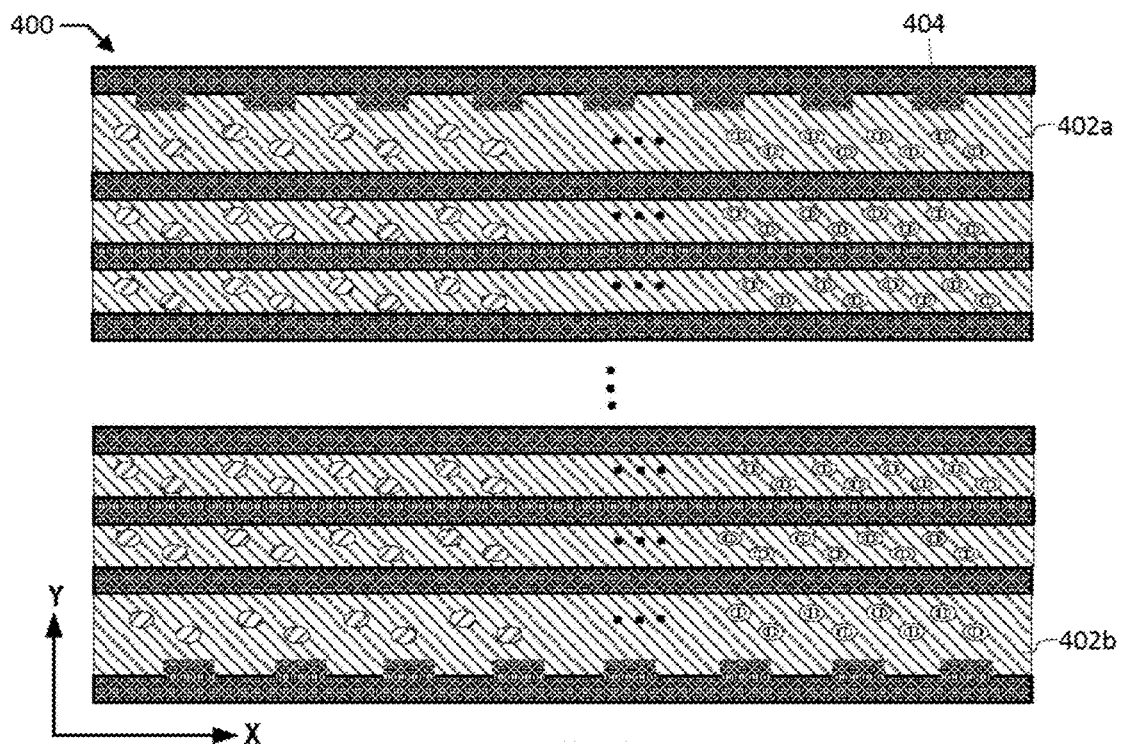
FIG. 4A illustrates another cross-section view along A-A' direction of the exemplary memory device in FIG. 1A with widened edge stack portions according to various embodiments of the present disclosure.

FIG. 4A illustrates a cross-section view of an example memory device 400 with a square wave shape in widened edge stack portions, according to various embodiments of the present disclosure. As illustrated, compared to the memory device 100 illustrated in FIG. 1B, the memory device 400 not only has a large width in the edge stack portions 402a and 402b, but the outer sidewall of the edge stack portion 402a or 402b also has a square wave shape 404.

One purpose of introducing a square wave shape on the outer sidewall of the edge stack portions 402a and 402b is to decrease the flow rate of the liquid during the wet/dry cycles in a fabrication process of manufacturing the memory device 400. This then decreases the pressure applied to the outer sidewall of the edge portions, thereby decreasing the pressure difference between the outer sidewall and inner sidewall of the edge portions in the fabrication process. The decreased pressure difference between the outer and inner sidewalls of the edge portions also lowers the possibility of the tilting of the edge portions in the formation of the memory device 400 illustrated in FIG. 4A.

It is to be noted that, to decrease the flow rate of the liquid during the wet/dry cycles, other shapes of the outer sidewall of the edge portions are also possible and contemplated in the present disclosure. These other shapes may include, but are not limited to, pulse wave, sine wave, sawtooth, and triangle wave, or a partial of each kind of wave (the introduced different shapes, including the square wave structure described above, may be also referred to as "dam" structure or simply convex structure). In addition, the specific parameters (such as the pulse width of each wave, the angles of the triangle wave, etc.) for these different waves may vary and may be specifically designed based on the determined pressure difference and the ease of manufacturing these waves, among other possible factors.

Figure 4B:
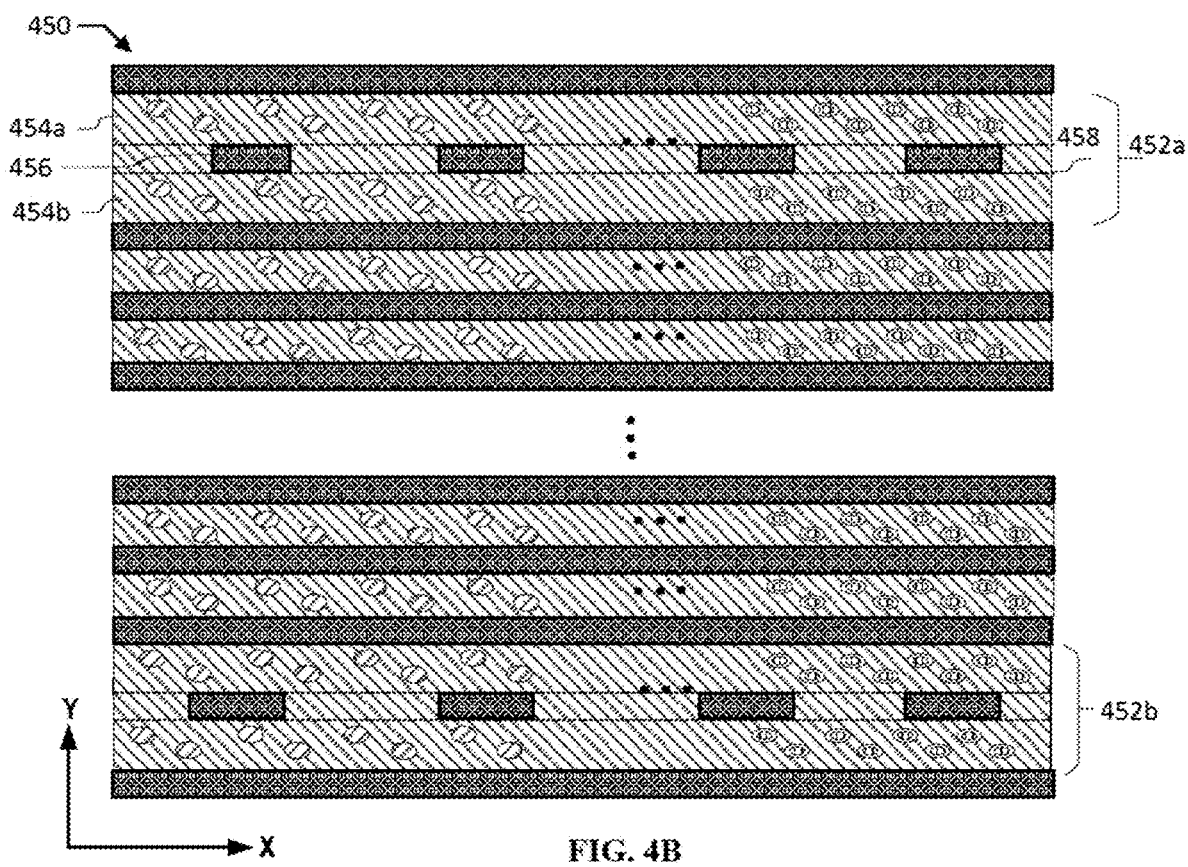
FIG. 4B illustrates another cross-section view along A-A' direction of the exemplary memory device in FIG. 1A with widened edge stack portions according to various embodiments of the present disclosure.

FIG. 4B illustrates a cross-section view of another example memory device in accordance with various embodiments. As illustrated, the example memory device 450 in FIG. 4B includes edge stack portions 452a/452b each having one or more sub-GLS (gate line slit) structures 456 formed vertically through the stack structure at edges of the stack structure. In various embodiments, the edge stack portion 452a/452b may have a width, between corresponding adjacent gate line slit structures at the edge of the stack structure, larger than, e.g., at least two times larger than, the non-edge stack portion of the stack structure. The one or more sub-GLS structures may be configured lined up with each other or may be randomly disposed in the edge stack portion 452a/452b.

In one embodiment, the edge stack portions 452a/452b may be formed by binding an edge stack portion with its adjacent non-edge stack portion. For example, compared to the memory device 100 illustrated in FIG. 1B, the edge stack portion 452a/452b of the memory device 450 may be configured more like a binding of an original edge stack portion 454a with an immediate adjacent stack portion 454b by breaking the gate line slit structure 456 between the two portions to form to form sub-GLS, as shown in FIG. 4B.

In some embodiments, the different parts 454a, 454a, and 456 in a bound edge stack portion are formed through a single process. For example, the photomask used in the etching process in forming the gate line slits may be shaped to have a design pattern that matches the bound edge stack portions 452a and 452b.

In some embodiments, to form the bound edge stack portions 452a and 452b, the photomask used to form the gate line slits does not require a great change when compared to existing photomasks for forming other existing memory devices. For example, as previously described, the gate line slit structures may extend continuously to form memory blocks, or may extend discretely to form memory fingers. Therefore, the existing technologies used to form memory fingers may be easily adapted to form the bound edge stack portions disclosed herein by adjusting the lengths of gaps in the design pattern of the photomask for forming a row of discrete gate line slits. For example, while the lengths of gaps in the design pattern of the photomask for forming the memory fingers are generally small, the lengths of gaps in the design pattern of the photomask for forming the disclosed bound edge stack portions can be greatly increased, as illustrated by the dotted block 458 in FIG. 4B. In one example, to be consistent with other existing manufacturing facilities and/or parameters used in the fabrication processes, a formed bound edge stack portion may have a width that equals twice the width of non-edge stack portions plus the width of a gate line slit between the adjacent non-edge stack portions, as illustrated in FIG. 4B.

The inclusion of bound edge stack portions in forming a memory device has certain advantages. For example, the existing technologies or facilities can be easily adapted to form the memory devices with bound edge stack portions as described above. In addition, in a fabrication process of forming the memory device 450, the intertwined trenches within the bound edge portions also slow down the flow rate of the liquid around the bound edge portions, thereby further lowering the possibility of tilting the edge portions in the fabrication process.

It is to be noted that, while two additional strategies are illustrated in FIGS. 4A-4B, the present disclosure is not limited to the strategies described above in FIG. 1B and FIGS. 4A-4B. In some embodiments, there may be additional strategies that can be applied to strengthen the edge portions during a fabrication process. In one example, a simple additional protection layer may be added to the edge portions after forming the gate line slits. In another example, controlling the flow rate of the liquid surrounding the edge portions may also lower the possibility of tilting the edge portions and/or non-edge portions. Other possible strategies to strengthen the edge portions during a fabrication process are also contemplated by the disclosure.

It is also to be noted that, while there are word line contact plugs 142 and memory cell strings 68 illustrated in the edge stack portions in FIGS. 1B and 4A-4B, in some embodiments, these edge stack portions in the memory devices 100, 400, and 450 may or may not include word line contact plugs and memory cell strings. These edge stack portions in the memory devices 100, 400, and 450 may or may not be used for storage, and thus may be referred to as dummy structures such as dummy blocks or dummy fingers. It is also to be noted that while the word line contact plugs 142 and memory cell strings 68 are illustrated to have an ellipse shape in FIGS. 1B and 4A-4B, the word line contact plugs 142 and memory cell strings 68 are not limited to the illustrated shapes, but rather can be in many other different shapes, such as circle, flower, and so on.

In addition, while two edge stack portions are widened in each memory device 100, 400, and 450, in some embodiments, there may be only one edge stack portion widened in each memory device 100, 400, or 450. For instance, while one edge stack portion is widened, the other edge stack portion in a memory device may have a same width as other non-edge stack portions.

Figure 5A:
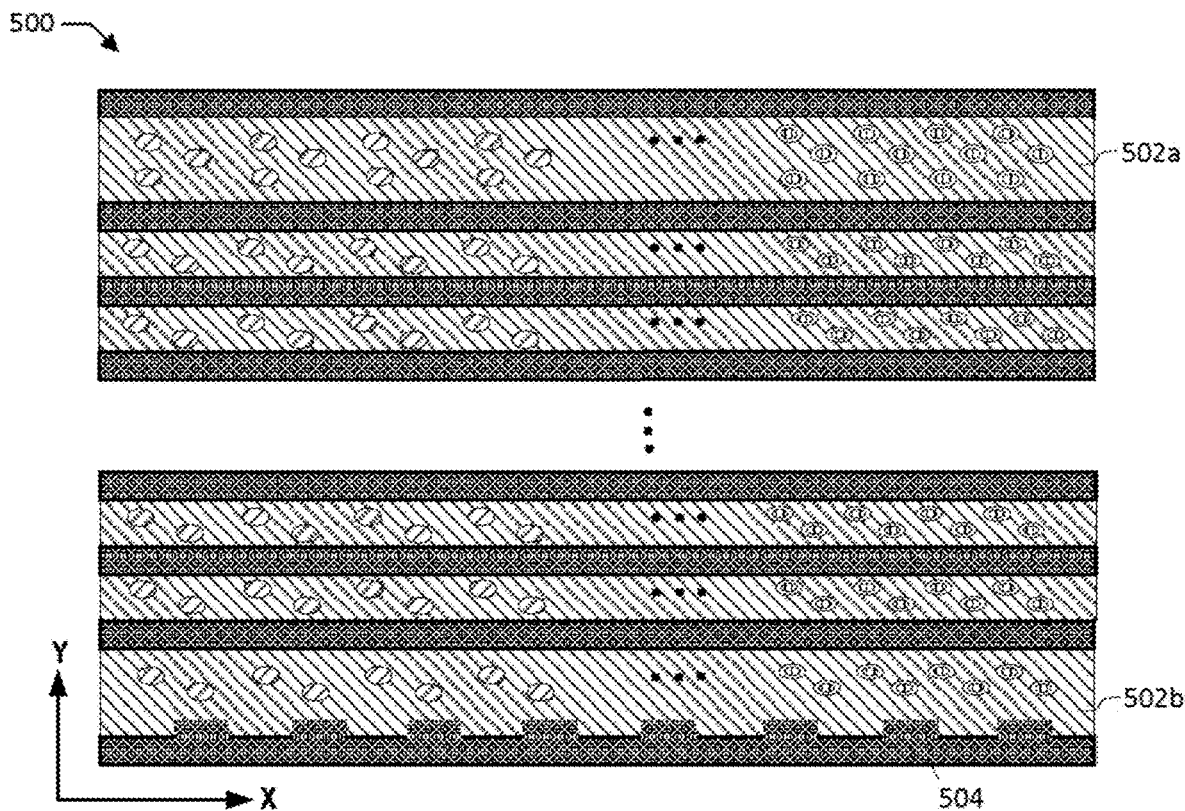
FIGS. 5A-5C illustrate cross-section views long A-A' direction of the exemplary memory device in FIG. 1A with different widened edge stack portions according to various embodiments of the present disclosure.
Figure 5B:
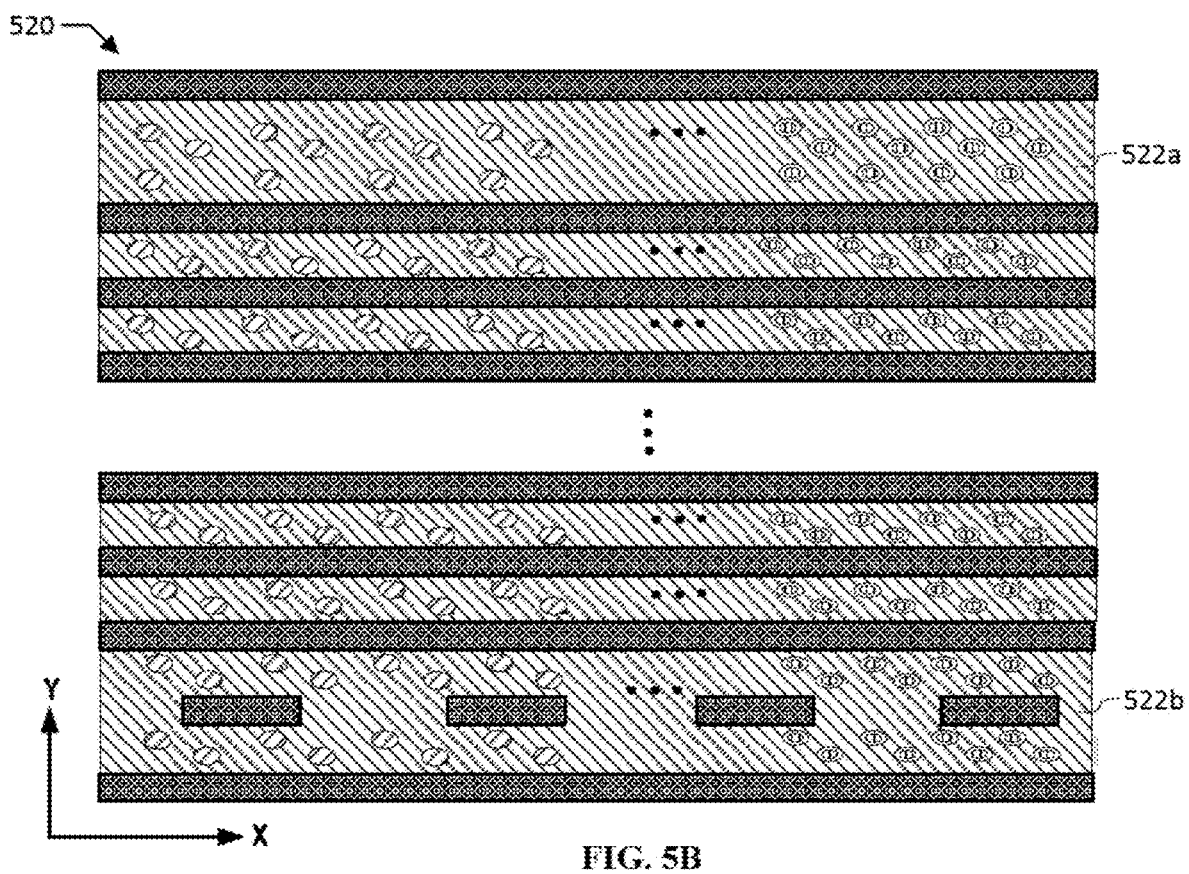
Figure 5C:
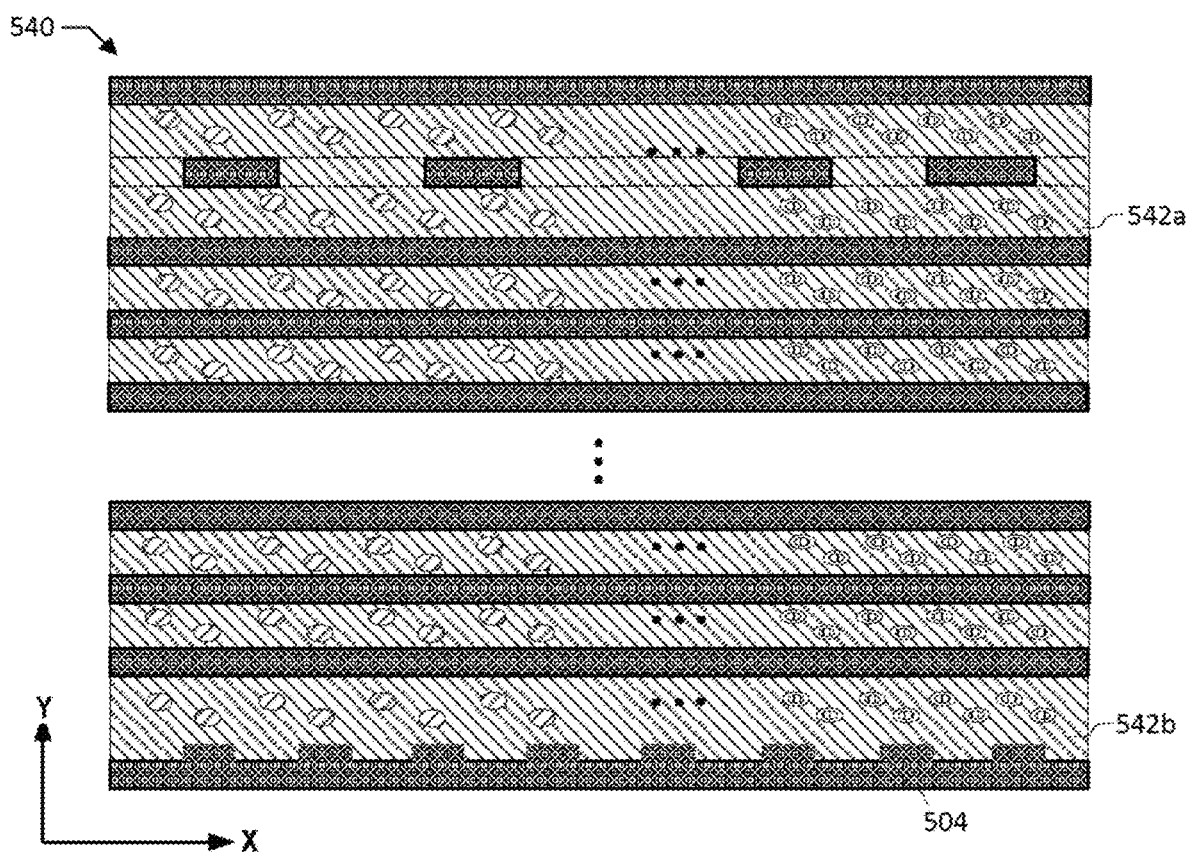

It is to be further noted that, while two similar edge stack portions are illustrated in each memory device 100, 400, or 450, in some embodiments, the two edge stack portions included in a memory device may be different, as further illustrated in FIGS. 5A-5C.

FIG. 5A illustrates a cross-section view of an exemplary memory device 500 with two different edge stack portions according to various embodiments of the present disclosure. As illustrated, a first edge stack portion 502a in the memory device 500 is a widened stack portion without a dam structure, while a second edge stack portion 502b is a widened stack portion with a dam structure 504.

FIG. 5B illustrates a cross-section view of another exemplary memory device 520 with two different edge stack portions, according to various embodiments of the present disclosure. As illustrated, a first edge stack portion 522a in the memory device 520 is a widened stack portion without a dam structure, while a second edge stack portion 522b is a bound edge stack portion.

FIG. 5C illustrates a cross-section view of another exemplary memory device 540 with two different edge stack portions, according to various embodiments of the present disclosure. As illustrated, a first edge stack portion 542a in the memory device 540 is a bound edge stack portion, while a second edge stack portion 542b is a widened stack portion with a dam structure.

In some embodiments, the edge stack portions may be in shapes other than those illustrated in FIGS. 1B, 4A-5C, depending on the design pattern of the photomask used in a fabrication process. For example, there may be more than one widened stack portions (e.g., two or more edge/adjacent stack portions are widened) on each edge, as described earlier.

Various embodiments of the present disclosure also provide a method for forming memory devices described above. The memory devices may be formed by controlling the design pattern of the photomask used in the formation of gate line slits.

Figure 6:
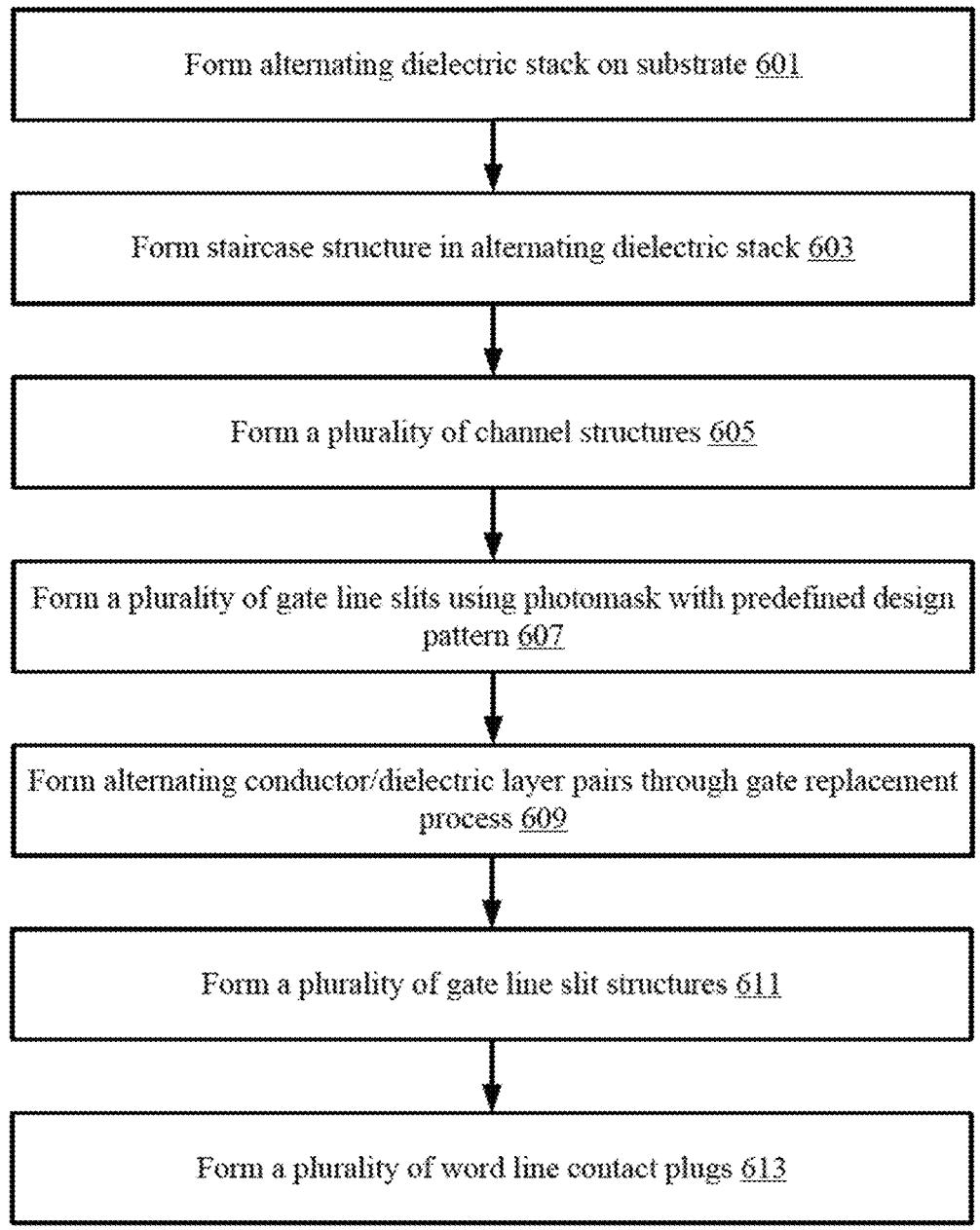
FIG. 6 illustrates an exemplary method for forming a memory device with a widened edge stack portion according to various embodiments of the present disclosure.

FIG. 6 illustrates an exemplary method 600 for forming a memory device with widened edge stack portions according to various embodiments. For example, the method includes: providing a substrate, forming a stack structure on the substrate, forming a plurality of gate line slits that vertically divide the stack structure into a plurality of different portions, where at least one edge portion has a different shape compared to other non-edge portions, and filling the gate line slits to form gate line slit structures. The method 600 may include additional steps for forming other components of the memory device, as further described in detail below. In the following, the method 600 is described with reference to different structures illustrated in FIGS. 7A-7C and different design patterns of photomask illustrated in FIGS. 8A-8F.

At 601, the method 600 starts by forming an alternating dielectric stack 720 on a substrate 710. The substrate 710 may include silicon (e.g., single crystalline silicon), silicon germanium (SiGe), gallium arsenide (GaAs), germanium (Ge), silicon on insulator (SOI), germanium on insulator (GOI), or any other suitable materials. The substrate 710 of the in-fabrication structure 700 may include two lateral surfaces (e.g., a top surface and a bottom surface) extending laterally in the plane defined by the x-axis and the y-axis, both of which are perpendicular to the z-axis. The alternating dielectric stack 720 may include alternating sacrificial layers 722 and dielectric layers 724 (a sacrificial layer and an adjacent dielectric layer may be referred to as a "dielectric layer pair") and may be formed on the substrate 710 by one or more thin film deposition processes including, but not limited to, CVD, PVD, ALD, or any combination thereof. In some embodiments, the alternating dielectric stack 720 may include a core region 30 and one or more staircase regions 40.

Figure 7A:
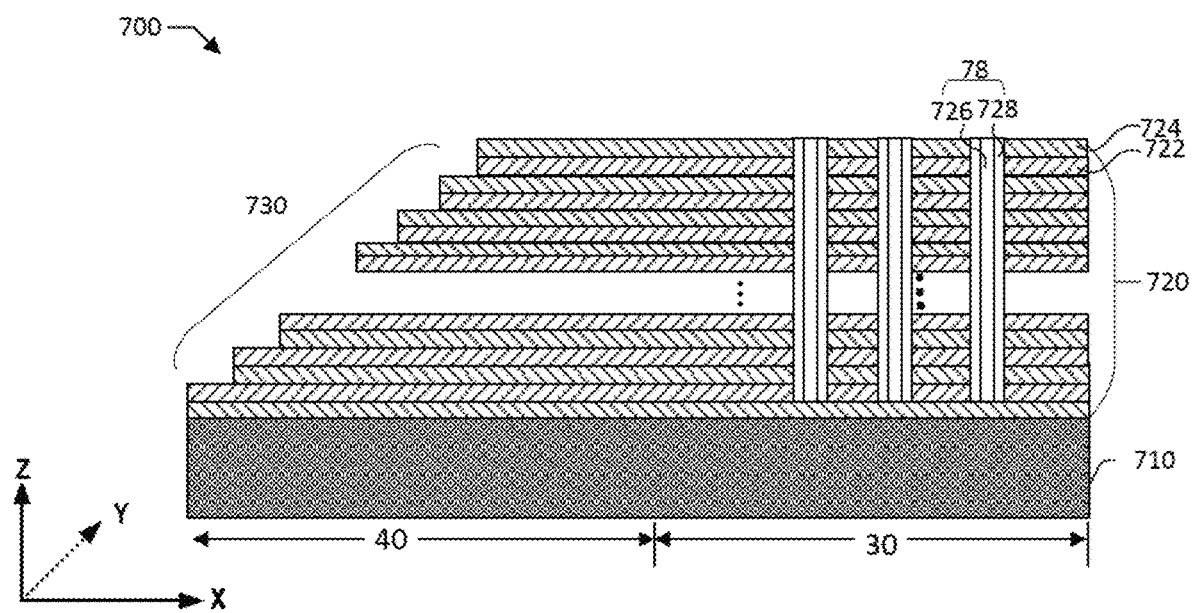
FIGS. 7A-7C illustrate in-fabrication memory device structures in different stages during a fabrication process according to various embodiments of the present disclosure.
Figure 7B:
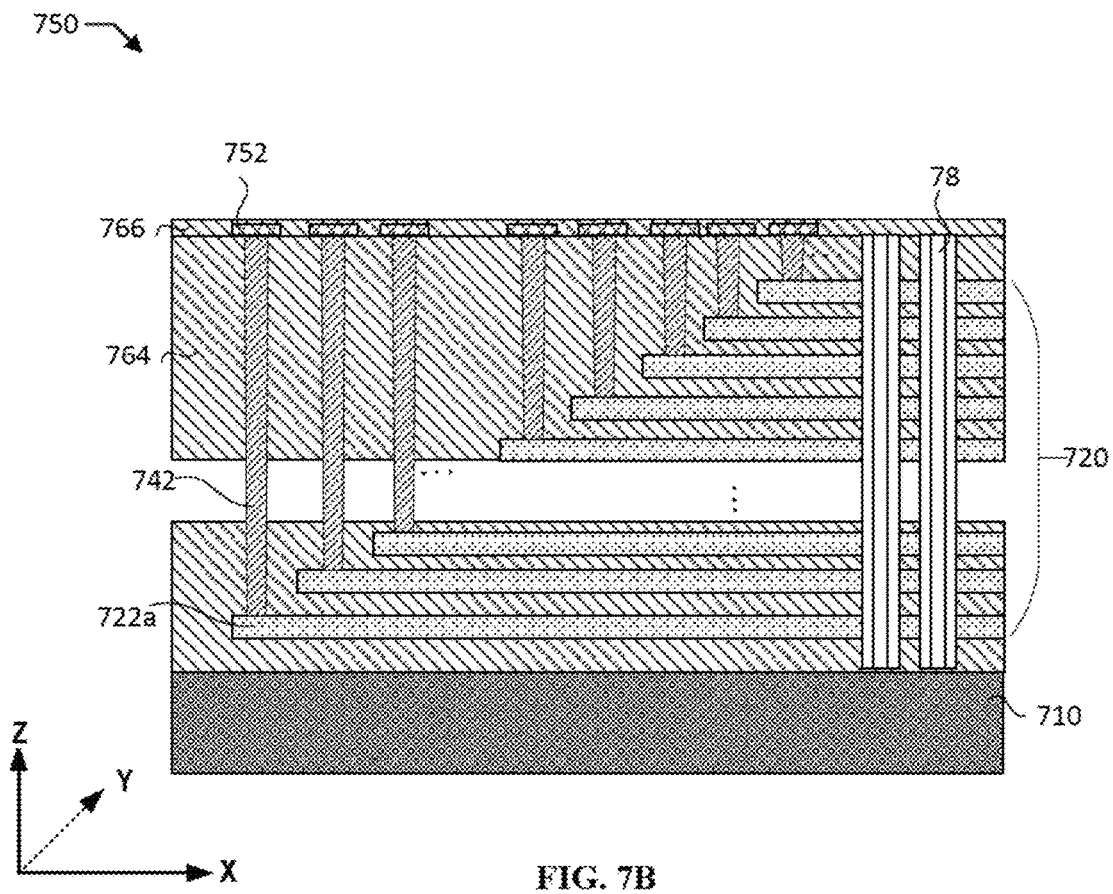

At 603, a staircase structure 730 is formed in the staircase region 40 of the alternating dielectric stack 720. In some embodiments, the staircase structure 730 is formed by performing a plurality of so-called "trim-etch" cycles to the alternating dielectric stack 720 toward the substrate 710. Due to the repeated trim-etch cycles applied to the alternating dielectric stack 720, alternating dielectric stack 720 can have one or more tilted edges and an upper dielectric layer pair is shorter than a lower one, as illustrated in FIG. 7A.

At 605, a plurality of channel structures 78 are formed in the core region 30 of the alternating dielectric stack 720. To form the channel structures 78, a plurality of openings may be etched vertically in the core region. In some embodiments, the plurality of openings are formed such that each hole becomes the location for growing an individual memory cell string in the later processes. Fabrication processes for forming openings may include wet and/or dry etching, such as deep DRIE. The etching of openings may continue until it reaches the substrate. In some embodiments, each channel structure 78 may include a semiconductor channel and a composite layer. To form a channel structure 78, the composite layer and semiconductor channel may be sequentially formed along the sidewall of and the bottom surface of an opening. In some embodiments, the composite layer may include a blocking layer, a storage layer, and a tunneling layer. In some embodiments, the blocking layer, storage layer, and tunneling layer are first deposited along the sidewall and bottom surface of an opening in this order using one or more thin film deposition processes, such as ALD, CVD, PVD, any other suitable processes, or any combination thereof, to form the composite layer. The semiconductor channel can then be formed by depositing a semiconductor material, such as polysilicon (e.g., undoped polysilicon), over the tunneling layer using one or more thin film deposition processes, such as ALD, CVD, PVD, any other suitable processes, or any combination thereof. In some embodiments, a first silicon oxide layer, a silicon nitride layer, a second silicon oxide layer, and a polysilicon layer (a "SONO" structure) are sequentially deposited to form the blocking layer, storage layer, and tunneling layer of the composite layer and semiconductor channel. In some embodiments, after forming the channel structures 78, a dielectric layer 764 may cover the formed structure including the core region and the staircase region, as illustrated in the in-fabrication structure 750 in FIG. 7B.

At 607, gate line slits are formed by using a photomask with a predefined design pattern. The gate line slits may be formed by etching the alternating dielectric stack 720 using a photomask, to form a plurality of vertically aligned trenches (slits) to divide the alternating dielectric stack into a plurality of dielectric-stack portions. The gate line slits may reach the substrate 710 by etching the alternating dielectric stack 720 to pass through the entire height of the dielectric stack and reach the substrate. Each dielectric-stack portion may be formed between corresponding adjacent gate line slits. The plurality of gate line slits may be formed in a manner such that at least one edge dielectric-stack portion includes a configuration different from a non-edge dielectric-stack portion of the plurality of dielectric-stack portions. For example, FIGS. 8A-8F illustrate different design patterns of a photomask that may be used in the formation of the memory device with widened edge stack portion(s). As such, when subsequently forming the plurality of stack portions by replacing the sacrificial layers of the alternating dielectric stack with conductor layers, at least one edge stack portion of the plurality of stack portions may provide a configuration different from any non-edge stack portion.

In various embodiments, before forming the plurality of gate line slits, a dimension, such as a width, of the at least one edge dielectric-stack portion may be determined based on: for example, a height of the alternating dielectric stack over the substrate, a surface tension and a contact angle of a liquid (e.g., used in wet etching) applied for forming the gate line slits, and/or a desired width of subsequently formed gate line slit structure in corresponding gate line slit.

At 609, alternating conductor/dielectric layer pairs are formed through a gate replacement process to replace the sacrificial layers with conductor layers. The replacement of the sacrificial layers with conductor layers may be performed by wet etching the sacrificial layers selective to the dielectric layers to form lateral recesses, then filling the lateral recesses with conductor layers. The conductor layers can be deposited using one or more thin film deposition processes, such as ALD, CVD, PVD, any other suitable processes, or any combination thereof. The conductor layers may include conductor materials including, but not limited to, W, Co, Cu, Al, polysilicon, silicides, or any combination thereof.

In some embodiments, a barrier layer, an adhesion layer, and/or a seed layer are deposited into lateral recesses prior to depositing conductor layers, such that the conductor layers are deposited on the barrier layer, an adhesion layer, and/or a seed layer. In some embodiments, the barrier layer, adhesion layer, and/or seed layer are formed along the sidewall and at the bottom of gate line slits as well. Stack structure including interleaved conductor layers and dielectric layers is thereby formed, replacing the dielectric stack.

At 611, the gate line slits are filled in with an insulation material to form gate line slit structures. The insulation material may include, but is not limited to, silicon oxide, silicon nitride, silicon oxynitride, low dielectric constant (low-k) dielectrics, or any combination thereof. Similar to the gate line slits, the gate line slit structures may continuously or discretely extend through the core region 30 and staircase region 40.

At 613, the word line contact plugs 742 are further formed in the staircase structure region. Each word line contact plug 742 may extend vertically through a dielectric layer 764 over the conductor/dielectric layer pairs formed in the staircase structure region. In some embodiments, an end of a word line contact plug lands on a word line tier (e.g., a part of the conductor layer in a conductor/dielectric layer pair), such that each word line contact plug is electrically connected to a corresponding word line tier. Each word line contact plug may be electrically connected to a corresponding word line tier (e.g., word line tier 722a in FIG. 7B) to individually address the corresponding word line of memory cell strings.

In some embodiments, the word line contact plugs 742 are formed by forming a vertical opening through the dielectric layer using a wet/dry etching process, followed by filling the opening with conductor materials and other possible materials (e.g., materials to form a barrier layer, an adhesion layer, and/or a seed layer) for conductor filling, adhesion, and/or other purposes. The conductor materials in the word line contact plugs may include, but are not limited to, W, Co, Cu, Al, doped silicon, silicides, or any combination thereof. The openings for forming word line contact plugs may be filled with conductor materials and other materials by using ALD, CVD, PVD, electroplating, any other suitable processes, or any combination thereof.

In some embodiments, the word line contact plugs 752 as well as the channel structure 78 described earlier may or may not be formed in the edge portions of the in-fabrication structure 700/750.

In some embodiments, the method 600 of forming the memory device further includes forming a contact pad 752 over each word line contact plug 742. The contact pad 752 may include conductor materials including, but not limited to, W, Co, Cu, Al, doped silicon, silicides, or any combination thereof.

In some embodiments, the method 600 of forming the memory device further includes forming an additional dielectric layer 766 over the surface of the memory device to cover the contact plugs 752 and the remaining area of the device surface, including the edge stack portions described above.

Figure 7C:
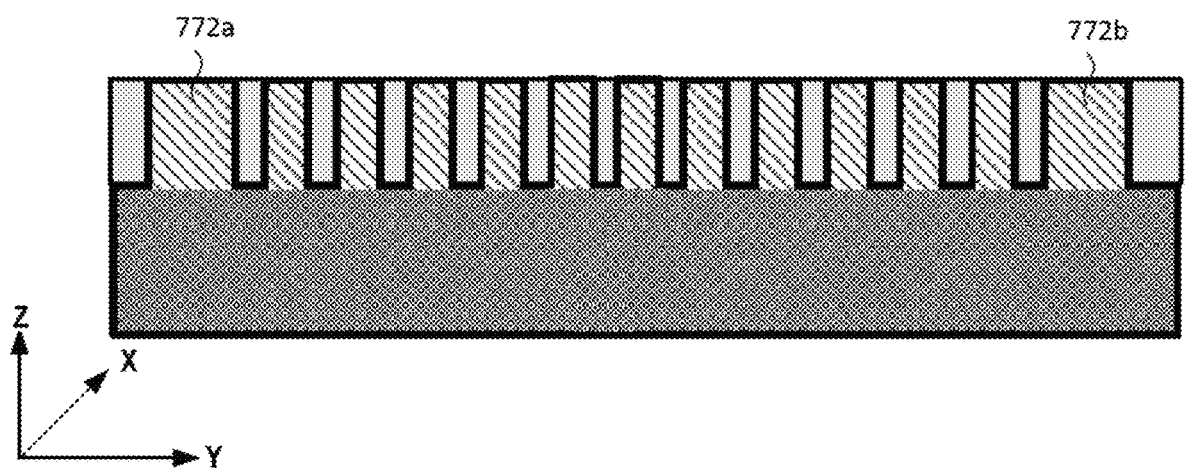

In some embodiments, the formed memory device may include widened edge stack portions 722a/722b as illustrated in FIG. 7C, which is a side view of the formed memory device. Depending on the photomask used in the formation of gate line slits at 607, the structure (e.g., shape and size) of the widened edge stack portions may vary, as further illustrated in FIGS. 8A-8F.

FIGS. 8A-8F illustrate different design patterns of a photomask used in forming the gate line slits according to various embodiments of the disclosure. As can be seen, the design patterns of the photomask may match the shapes of the edge stack portions of the memory devices 100, 400, 450, 500, 520, and 540 illustrated in FIGS. 1B and 4B-5C.

Figure 8A:
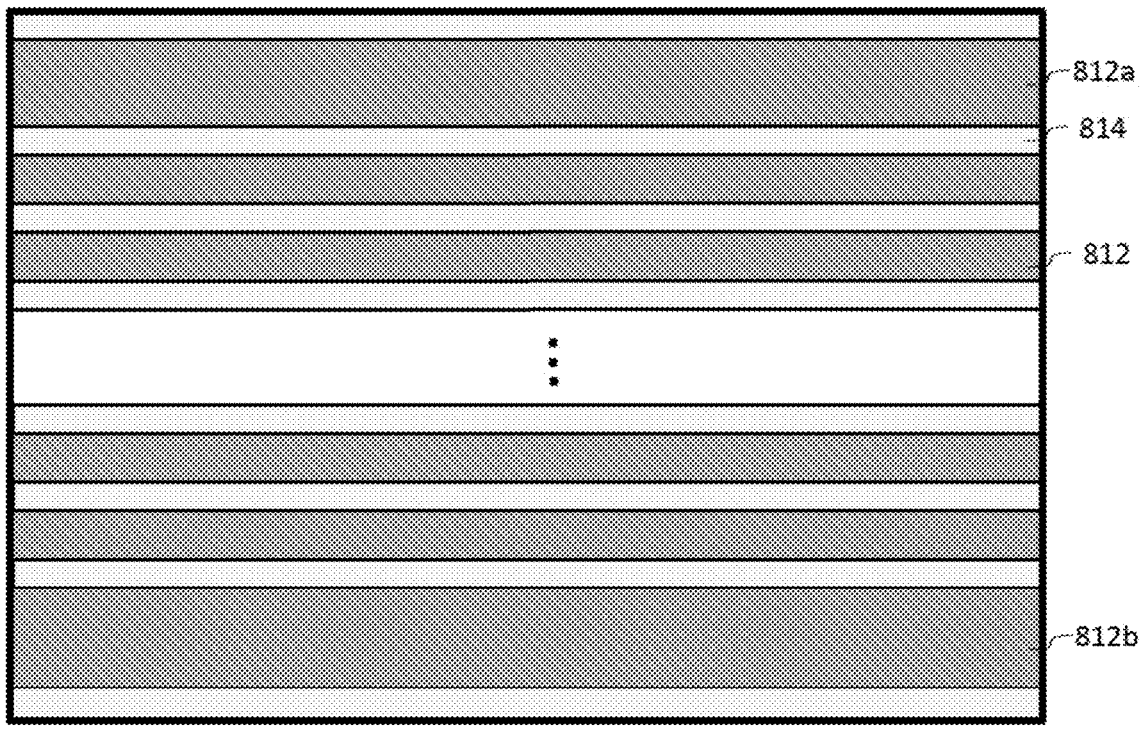
FIGS. 8A-8F illustrate various exemplary design patterns of a photomask used in a fabrication process of a memory device according to various embodiments of the present disclosure.

In FIG. 8A, the design pattern of photomask 810 for forming a memory device (e.g., memory device 100 in FIG. 1B) includes two edge frames 812a and 812b that have a large width when compared to other non-edge frames 812 between the two edge frames 812a and 812b. Each edge or non-edge frame may be parallel and in the shape of a rectangular block. The space 814 between these edge and non-edge frames may allow the etching of gate line slits during a fabrication process.

Figure 8B:
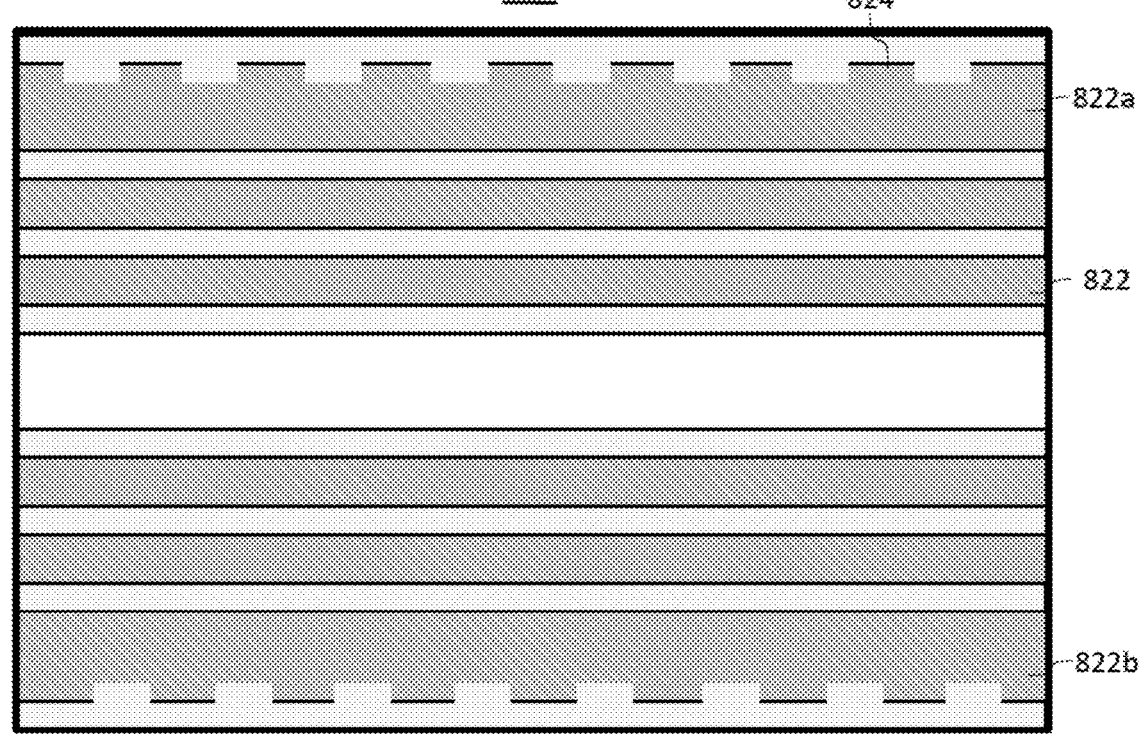

In FIG. 8B, the design pattern of photomask 820 for forming a memory device (e.g., a memory device 400 in FIG. 4A) also includes two edge frames 822a and 822b that have a larger width when compared to other non-edge frames 822. As can be seen in FIG. 8B, besides a larger width, the two edge frames 822a/822b also have a square wave shape 824 on the outer side (e.g., the side facing toward the edges of the photomask) of the edge frames. As described earlier, the structure of edge frames is not limited to square wave shape but can be also in the shape of a pulse wave, sine wave, sawtooth, triangle wave, a partial of each kind of wave, and the like (these different shapes may be also referred to as "dam shape").

Figure 8C:
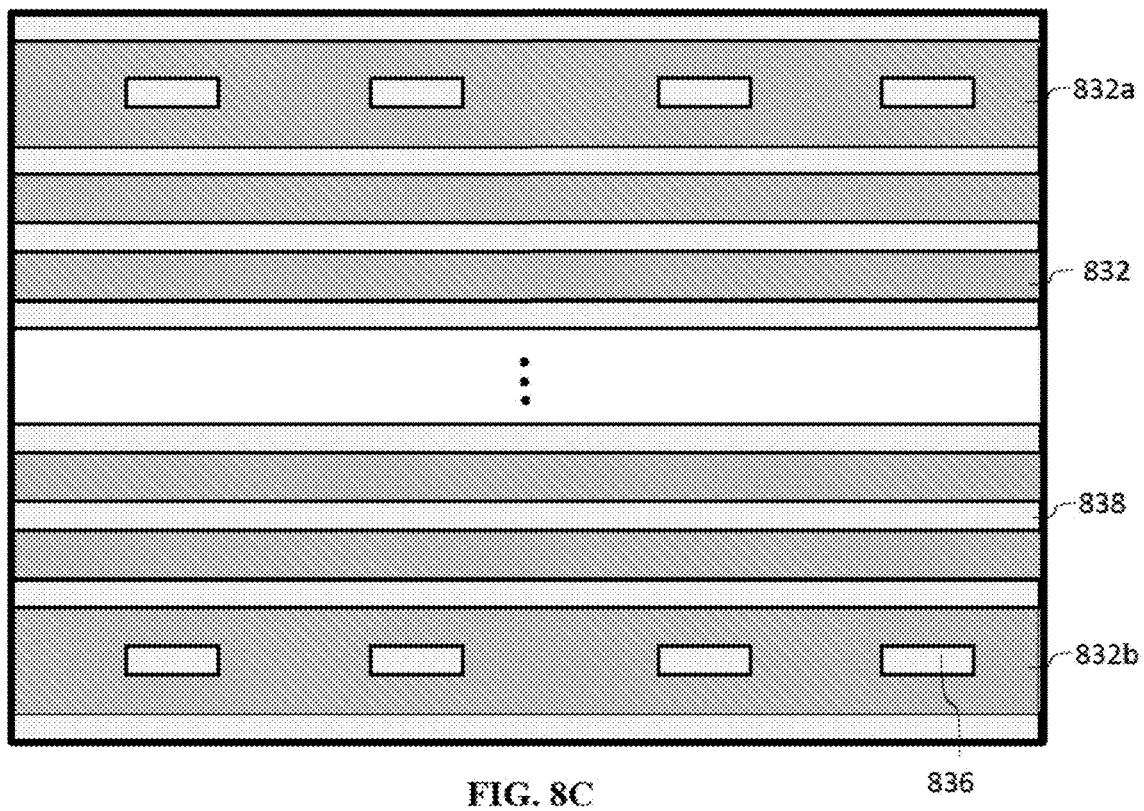

In FIG. 8C, the design pattern of photomask 830 for forming a memory device (e.g., memory device 450 in FIG. 4B) also includes two edge frames 832a and 832b that have a larger width when compared to other non-edge frames 834. In addition, within each edge frame 832a or 832b, there are also a row of holes 836 in the rectangular shape. These holes 836 may be arranged in the center of the edge frame 832a or 832b, and the width of the holes may match the width of the space between the non-edge frames 834 in the photomask 830, or may have a different width (e.g., smaller or larger than the width of the space between the non-edge frames).

Figure 8D:
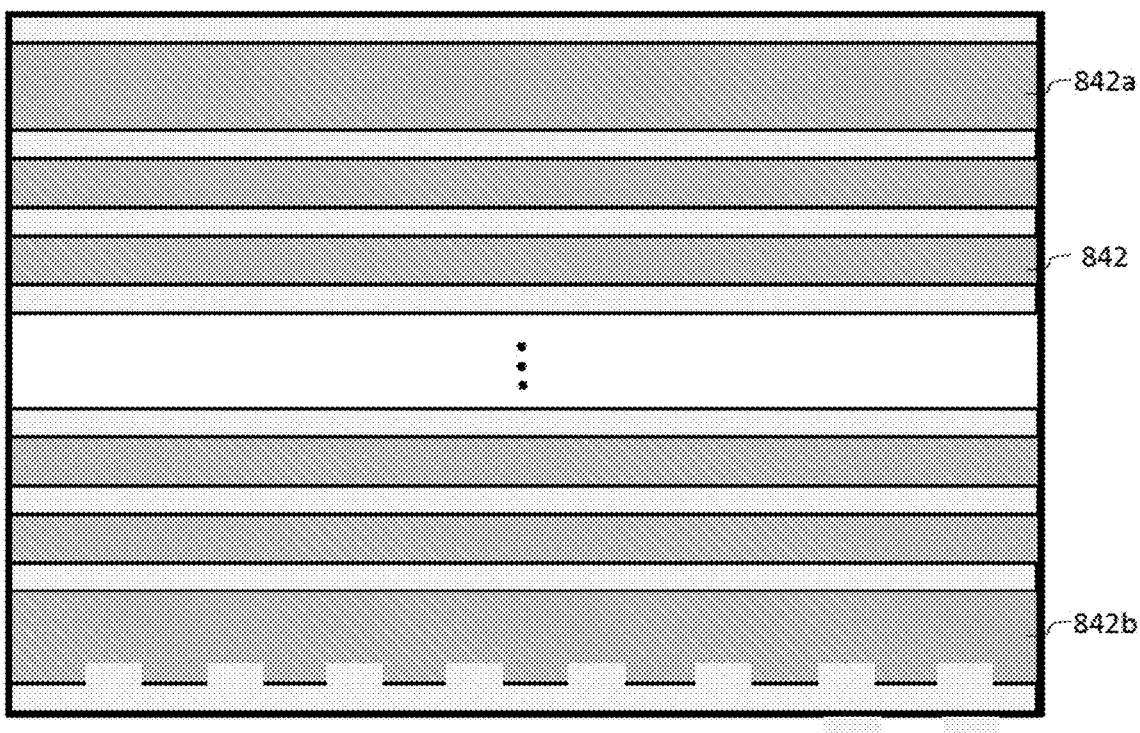

In FIG. 8D, the design pattern of photomask 840 for forming a memory device (e.g., memory device 500 in FIG. 5A) also includes two edge frames 842a and 842b that have a larger width when compared to other non-edge frames 844. As can be seen in FIG. 8D, besides a larger width, the edge frame 842b also has a dam shape on the outer side (e.g., the side facing toward the edges of the photomask) of the edge frame. As described earlier, the dam shape of the edge frame 842b can be in the shape of a square wave shape, pulse wave, sine wave, sawtooth, triangle wave, or a partial of each kind of wave, and the like.

Figure 8E:
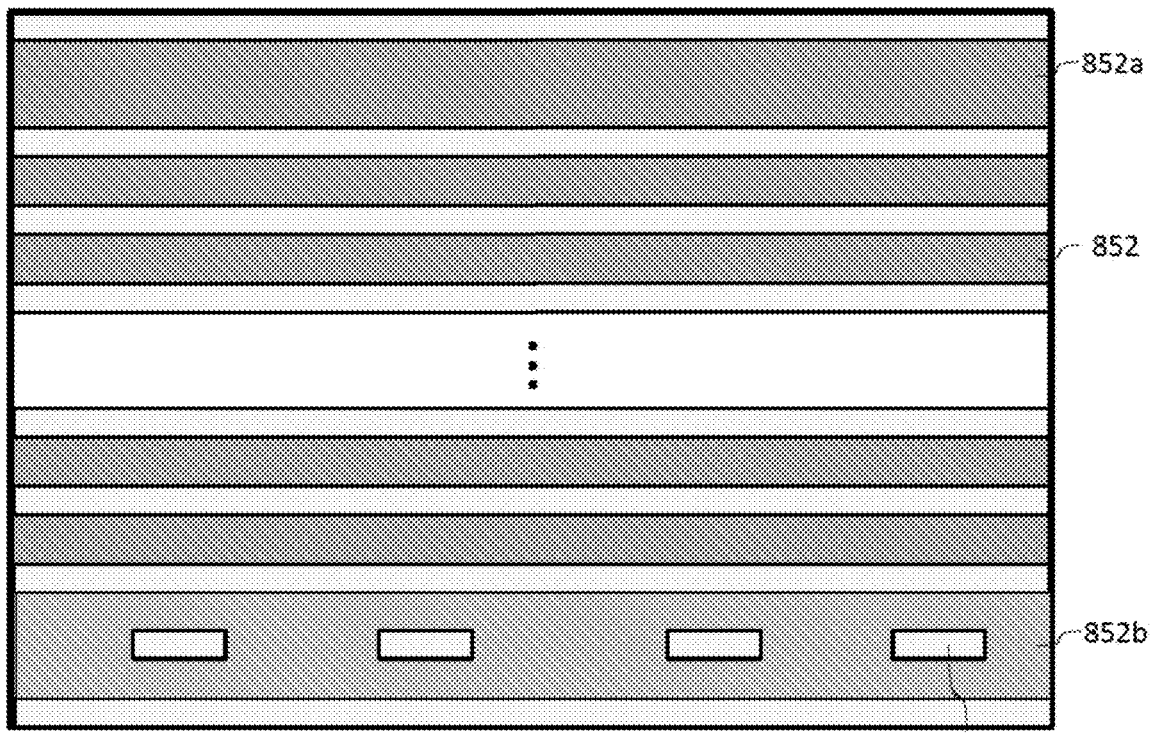

In FIG. 8E, the design pattern of the photomask 850 for forming a memory device (e.g., memory device 520 in FIG. 5B) also includes two edge frames 852a and 852b that have a larger width when compared to other non-edge frames 852. As can be seen in FIG. 8E, besides a larger width, the edge frame 852b also has a row of holes 854 in the rectangular shape, as described earlier in FIG. 8C.

Figure 8F:
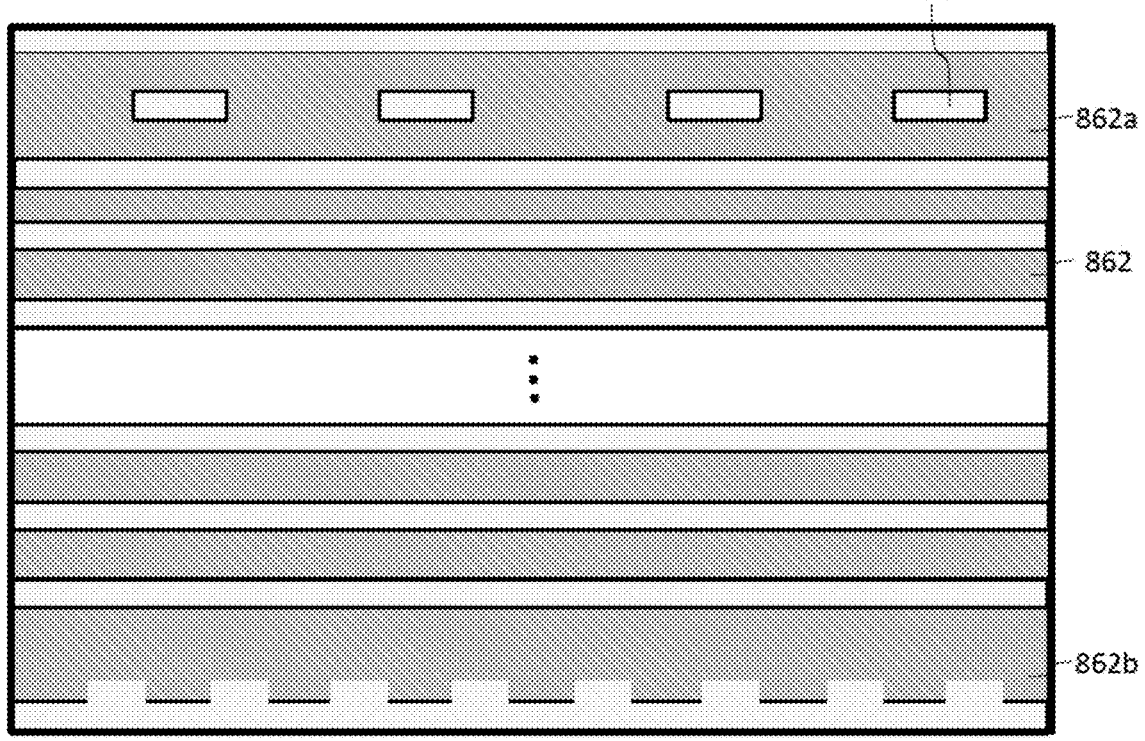

In FIG. 8F, the design pattern of the photomask 860 for forming a memory device (e.g., a memory device 540 in FIG. 5C) also includes two edge frames 862a and 862b that have a larger width when compared to other non-edge frames 862. As can be seen in FIG. 8E, besides a larger width, the edge frame 862a also has a number of holes 864 in the rectangular shape, and the edge frame 862b also has a dam shape on the outer side of the edge frame, as described earlier in FIG. 8B. It is to be noted that, in some embodiments, the row of holes in the edge frames of the above-described photomasks can be also in other different shapes, such as a sawtooth shape that may be better to slow down the flow rate of liquid during a wet/dry cycle in a fabrication process.

In some embodiments, the design pattern of the photomask for forming a memory device may be in shapes other than those illustrated in FIGS. 8A-8F. For example, there may be more than one wider frame (e.g., two or more frames are widened) on each edge or each side. In some embodiments, other design patterns are also possible and contemplated by the disclosure.

The above detailed descriptions only illustrate certain exemplary embodiments of the present disclosure, and are not intended to limit the scope of the present disclosure. Those skilled in the art may understand the specification as a whole and technical features in the various embodiments may be combined into other embodiments understandable to those persons of ordinary skill in the art. Any equivalent or modification thereof, without departing from the spirit and principle of the present disclosure, falls within the true scope of the present disclosure.

What is claimed is:

1. A memory device comprising:
   a stack structure; and
   a plurality of gate line slit (GLS) structures vertically extending through the stack structure, to divide the stack structure into a plurality of stack portions, wherein
   the plurality of GLS structures extend along a first direction in a lateral plane of the stack structure and are arranged along a second direction substantially perpendicular to the first direction;
   each stack portion is between corresponding adjacent GLS structures; and
   at least one edge stack portion, along the second direction, of the plurality of stack portions at edge of the stack structure includes a configuration different from a non-edge stack portion of the plurality of stack portions along the second direction.

2. The memory device according to claim 1, wherein the at least one edge stack portion is configured with at least a dimension, a shape, and/or a component different from the non-edge stack portion of the stack structure and defined by corresponding adjacent GLS structures at the edge of the stack structure.

3. The memory device according to claim 2, wherein the at least one edge stack portion is configured having a width in the second direction, between the corresponding adjacent GLS structures at the edge of the stack structure, larger than the non-edge stack portion of the stack structure.

4. The memory device according to claim 3, wherein the width of the at least one edge stack portion in the second direction is at least 1.5 times larger than a width of the non-edge stack portion of the stack structure in the second direction.

5. The memory device according to claim 2, wherein the at least one edge stack portion is configured having one or more convex structures each protruding toward an adjacent GLS structure at the edge of the stack structure, wherein the one or more convex structures have a shape of a square wave, a pulse wave, a sine wave, a sawtooth, a triangle wave, or a combination thereof.

6. The memory device according to claim 2, wherein the at least one edge stack portion at the edge of the stack structure further comprises one or more sub-GLS structures vertically through the at least one edge stack portion of the stack structure.

7. The memory device according to claim 6, wherein the one or more sub-GLS structures discretely extend along the first direction inside the at least one edge stack portion.

8. The memory device according to claim 7, wherein a width of the at least one edge stack portion comprising the one or more sub-GLS structures is at least double a width of the non-edge stack portion of the stack structure in the second direction.

9. The memory device according to claim 2, wherein
the plurality of stack portions includes two edge stack portions that are configured differently with one another in the dimension, the shape, and/or the component, and
the two edge stack portions are configured differently from the non-edge stack portion of the plurality of stack portions.

10. The memory device according to claim 1, wherein the stack structure comprises alternating conductor/dielectric layer pairs.

11. The memory device according to claim 1, wherein
the non-edge stack portion of the stack structure comprises a channel structure or a word line contact plug, and
the at least one edge stack portion of the stack structure is devoid of a channel structure or a word line contact plug.

12. A memory device comprising:
a memory plane comprising:
   memory blocks and gate line slit (GLS) structures extending vertically through the memory blocks, wherein
      the GLS structures extend along a first direction and are arranged along a second direction substantially perpendicular to the first direction; and
      at least one edge block, along the second direction, of the memory plane between an edge GLS structure and an adjacent GLS structure includes a configuration different from a non-edge block of the memory plane along the second direction.

13. The memory device according to claim 12, wherein the at least one edge block is configured with at least a dimension, a shape, and/or a component different from the non-edge block of the memory plane.

14. The memory device according to claim 13, wherein the at least one edge block comprises:
   a width at least 1.5 times larger than a width of the non-edge block in the second direction,
   a shape comprising square wave, pulse wave, sine wave, sawtooth, triangle wave, or a combination thereof, and/or
   one or more sub-GLS structures vertically through the at least one edge block.

15. The memory device according to claim 12, wherein
the non-edge block comprises a channel structure or a word line contact plug, and
the at least one edge block is devoid of a channel structure or a word line contact plug.

* * * * *